(12) United States Patent
Mazumder et al.

(10) Patent No.: US 12,189,414 B2
(45) Date of Patent: Jan. 7, 2025

(54) MEMORY DEVICE CLOCK SWAPPING

(71) Applicant: Micron Technology, Inc., Boise, ID (US)

(72) Inventors: Kallol Mazumder, Dallas, TX (US); Navya Sri Sreeram, McKinney, TX (US); Scott E. Smith, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 122 days.

(21) Appl. No.: 17/897,957

(22) Filed: Aug. 29, 2022

(65) Prior Publication Data

US 2024/0069589 A1 Feb. 29, 2024

(51) Int. Cl.
*G06F 1/08* (2006.01)
*G06F 1/10* (2006.01)

(52) U.S. Cl.
CPC . *G06F 1/08* (2013.01); *G06F 1/10* (2013.01)

(58) Field of Classification Search
CPC .................. G06F 1/08; G06F 1/12; G06F 1/10
See application file for complete search history.

(56) References Cited

U.S. PATENT DOCUMENTS

| | | | |
|---|---|---|---|
| 6,618,791 B1 * | 9/2003 | Dodd | G06F 1/3275 711/105 |
| 11,368,142 B1 * | 6/2022 | Kuzmenka | G06F 1/04 |
| 2007/0147166 A1 | 6/2007 | Lee | |
| 2014/0313837 A1 | 10/2014 | Kwak | |
| 2018/0083763 A1 * | 3/2018 | Black | H04W 52/02 |
| 2019/0020342 A1 | 1/2019 | Mazumder | |
| 2019/0392886 A1 * | 12/2019 | Cox | G11C 11/4093 |
| 2020/0393869 A1 * | 12/2020 | August | G06F 1/12 |
| 2021/0183416 A1 | 6/2021 | Yoshida | |
| 2021/0343328 A1 | 11/2021 | Shin et al. | |

FOREIGN PATENT DOCUMENTS

WO WO-2024049715 A1 3/2024

OTHER PUBLICATIONS

"International Application Serial No. PCT/US2023/031162, International Search Report mailed Dec. 12, 2023", 3 pgs.
"International Application Serial No. PCT/US2023/031162, Written Opinion mailed Dec. 12, 2023", 4 pgs.

* cited by examiner

*Primary Examiner* — Raymond N Phan
(74) *Attorney, Agent, or Firm* — Schwegman Lundberg & Woessner, P.A.

(57) ABSTRACT

An example memory apparatus includes clock circuitry. The clock circuitry can generate first and second clock signals based on a system clock signal, with the first and second clock signals being mutually out of phase. The apparatus can include detection circuitry to provide a detection result indicating whether an initial operation of a self-refresh exit operation coincides with a rising edge of the first clock signal or a rising edge of the second clock signal. The apparatus can include processing circuitry to provide an odd clock signal and an even clock signal based first and second clock signals and the detection result. The processing circuitry can provide the odd clock signal and the even clock signal out of phase or in phase with the first clock signal and the second clock signal depending on the detection result.

20 Claims, 16 Drawing Sheets

MEMORY DEVICE CLOCK SWAPPING

FIELD OF THE DISCLOSURE

Embodiments of the disclosure relate generally to memory devices. More specifically, embodiments relate to clock circuitry in memory devices.

BACKGROUND

Memory devices are semiconductor circuits that provide electronic storage of data for a host system (e.g., a computer or other electronic device). Memory devices may be volatile or non-volatile. Volatile memory requires power to maintain data and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

Some memory devices use circuitry to align output data with a system clock. However, this alignment becomes increasingly difficult as system clock frequency increases. Therefore, there is a general need to improve memory device operation at ever-increasing system clock speeds.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
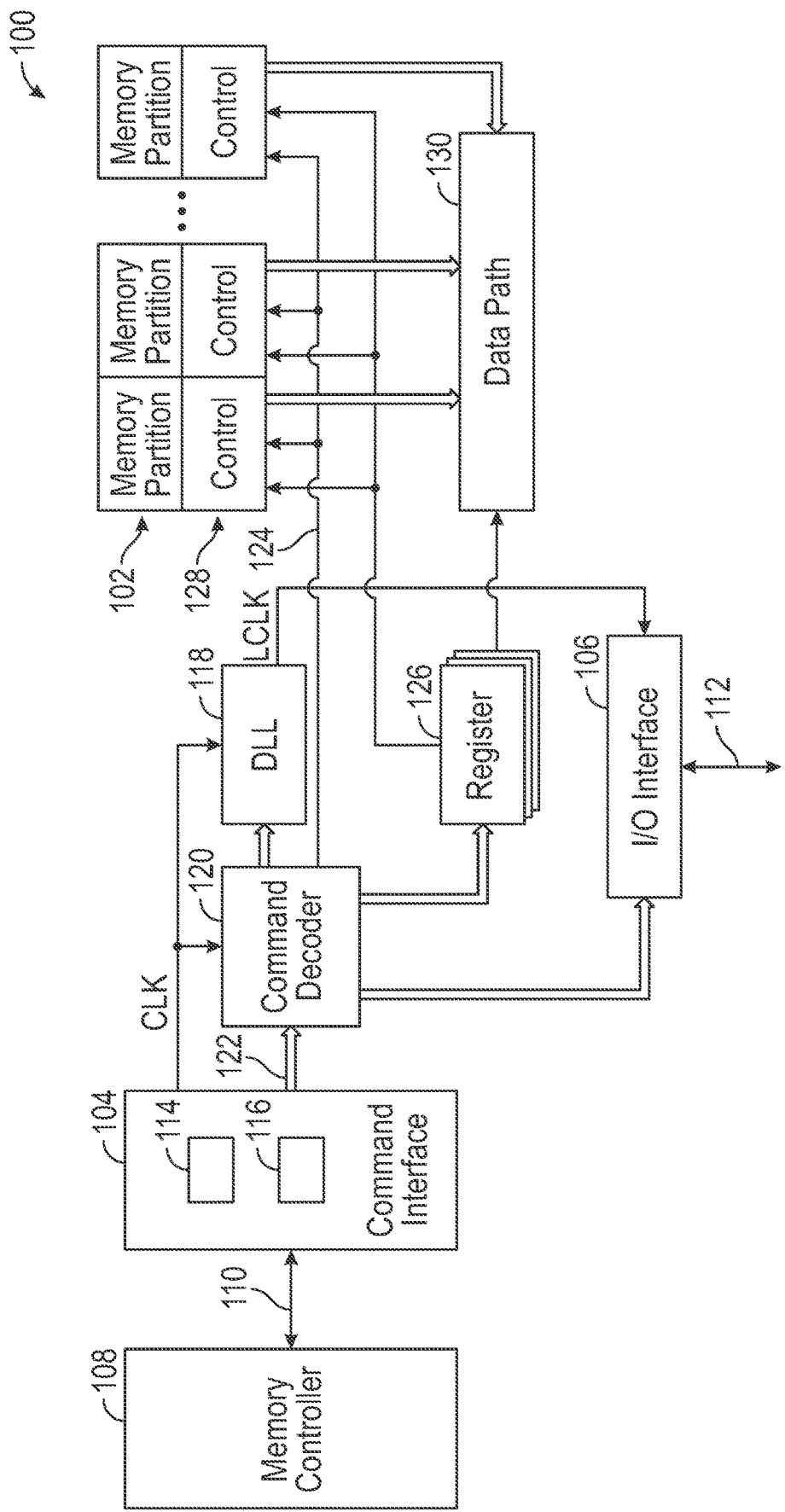
FIG. 1 illustrates generally an example block diagram of a memory device.

FIG. 1 illustrates generally a simplified block diagram of various features of a memory device 100. The block diagram of FIG. 1 can be a functional block diagram illustrating various functions of the memory device 100. In accordance with one embodiment, the memory device 100 may be a random access memory (RAM) device, a dynamic RAM (DRAM) device, a static RAM (SRAM) device (including a double data rate SRAM device), holographic RAM (HRAM) flash memory, and/or a phase change memory (PCM) device and/or other chalcogenide-based memory, such as self-selecting memories (SSM). Moreover, the memory cells of the memory device can each have a corresponding logic storing device (e.g., a capacitor, a resistor, or a chalcogenide device).

In an example, the memory device 100 comprises a cell, or array of cells, arranged according to a planar architecture, with discrete cells or memory elements located at crossings of Word Lines (WL) and Bit Lines (BL). In some examples, a memory element comprising chalcogenide materials can be provided at such WL and BL crossings and can behave both as a selector and a memory element. In a two-dimensional array, alternating decks of WL and BL can be provided or layered to provide a 3D memory array.

The memory device 100 can include memory partitions 102, and each memory partition 102 can include one or more cell arrays (i.e., memory arrays), such as comprising chalcogenide materials. Various configurations, organizations, and sizes of a memory partition 102 on the memory device 100 can be used depending on the application and design of the overall system. For example, each of the memory partitions 102 can comprise a respective different die in a stacked memory device. In such a device, at least one die can be a primary die that interfaces with a host, or a memory controller 108, using an inter-device bus 110, and one or more other dies can be secondary dies that interface with the primary die using an intra-package bus 124. Arrays can also be sub-divided into multiple separately-addressable portions (e.g., into multiple channels, banks, ranks, etc.). Alternatively, a memory system can include multiple memory devices such as the memory device 100 of FIG. 1, where each memory device represents a separately-addressable sub-division (e.g., rank, etc.) of the memory capacity of the system. Accordingly, a memory device or a memory system with multiple memory devices, ranks, channels, banks or the like can include multiple terminals (e.g., clock terminals, CMD/ADD terminals, I/O terminals, etc.) that are dedicated to one or more, but less than all of, the separately-addressable portions. For example, a multi-channel memory device can include multiple terminals, each corresponding to one of the multiple channels of memory.

The memory device 100 can include a command interface 104 and an input/output interface 106. The command interface 104 can receive various signals from an external host device, such as a processor or controller (e.g., a memory controller 108) external to the memory device 100. In some embodiments, an inter-device bus 110 (or a signal path or a group of signal paths) can, individually or in combination, allow for bidirectional transmission of signals between the command interface 104 and the processor or controller (e.g., the memory controller 108).

In an example, the memory device 100 can include a second bus 112 (or a signal path or another group of signal paths) that can, individually or in combination, allow for bidirectional transmission of signals, including, for example, data signals, between the input/output interface 106 and, for example, the processor or controller (e.g., the memory controller 108). Thus, the processor or controller, for example, the memory controller 108, can provide various signals to the memory device 100 to facilitate transmission and receipt of data to be written to or read from the memory device 100.

In an example, the command decoder 120 can decode commands, such as read commands, write commands, register set commands, activate commands, etc., and provide access to a particular one of the memory partitions 102 corresponding to the command, such as via an intra-package bus 124. The command decoder 120 can transmit various signals to one or more registers 126 via a bus path (e.g., one or more global wiring lines). In an example, the memory device 100 can include various other decoders, such as row decoders and column decoders, to facilitate access to the various memory partitions 102. In one embodiment, each memory partition 102 can include a respective control block 128 that provides decoding (e.g., row and/or column decoding), as well as other features, such as timing control and data control, to facilitate the execution of commands to and from the respective memory partition 102.

In an example, the command decoder 120 or other component in the memory device 100 can provide register commands to the one or more of the registers 126, which can be used in operations of each of the memory partitions 102, each control block 128, and the like. For example, one of the registers 126 can define various modes of programmable operations and/or configurations of the memory device 100. The registers 126 can be included in semiconductor devices to define operations for various types of memory components, such as DRAM, synchronous DRAM, chalcogenide memories (e.g., PCM) or other types of memories. The registers 126 can receive various signals from the command decoder 120 via wiring lines that can include a common data path, a common address path, a common write command signal path, or a common read command signal path. The wiring lines can traverse the memory device 100 and couple to each register 126.

The registers 126 can be accessed or otherwise accessible by the memory controller 108. The registers 126 can be dispersed across the memory device 100 and the registers can represent or contain information such as configuration settings of the memory device 100 and/or specific components therein, status information about the memory device 100 and/or specific components therein, memory device 100 parameters and/or specific parameters for components of the memory device 100, or predetermined patterns that can be written across the memory device (e.g., in one or more of the memory partitions 102). Thus, while the registers 126 are illustrated in FIG. 1, it should be appreciated that additional and/or alternative registers can be located elsewhere in the memory device and can be accessed by the memory controller 108 (i.e., when in operation, the registers are accessed by the memory controller 108). Such accesses by the memory controller 108 can include, for example, reads of the registers (e.g., read accesses) and/or writes to the registers (e.g., write accesses).

In an example, the memory device 100 executes operations, such as read commands and write commands, based on the command/address signals received from an external device, such as a processor and/or by the memory controller 108. In one example, command/address signals are clocked to the command interface 104 using clock signals. The command interface 104 can include a command/address input circuit 116 that is configured to receive and transmit the commands to provide access to the memory partitions 102, through the command decoder 120. The command interface 104 can receive memory select signals that enable the memory device 100 to process commands on the incoming command/address signals. Access to specific memory partitions 102 within the memory device 100 can be encoded in the commands.

The command interface 104 can be configured to receive various other command signals. For example, a reset command can be used to reset the command interface 104, status registers, state machines and the like, during power-up or standby exit, for instance. Various signals to facilitate testing of the memory device 100 may be provided. For instance, test signals can be used to place the memory device 100 into a test mode for connectivity testing. The command interface 104 can be used to provide an alert signal or other alarm signal to the system processor or controller for certain errors that may be detected. In some embodiments, the input/output interface 106 can additionally or alternatively transmit an alert signal, for example, a thermal alert.

In an example, the command interface 104 can include or use a number of circuits, such as a clock input circuit 114 and a command/address input circuit 116, to ensure proper handling of the received signals. The command interface 104 can receive one or more clock signals from an external device, such as the memory controller 108. The command interface 104 can receive commands (e.g., read command, write command, etc.), that can be entered on, e.g., positive edges of the clock signal, and can receive data, such as can be transmitted or received on positive and/or negative edges of the clock signal. In some examples, the commands can have a variable clock length (e.g., one or more clocks can be used to receive the commands).

The clock input circuit 114 can receive the one or more clock signals and generate an internal clock signal CLK therefrom. In some embodiments, the internal clock signal CLK is supplied to an internal clock generator 118, such as a delay locked loop (DLL) circuit. The internal clock generator 118 generates a phase-controlled internal clock signal LCLK based on the received internal clock signal CLK. The phase controlled internal clock signal LCLK can be provided to the input/output interface 106, for instance, and can be used as a timing signal for determining an output timing of read data.

The internal clock signal CLK can be provided to various other components within the memory device 100 and can be used to generate various additional internal clock signals. For example, the internal clock signal CLK can be provided to a command decoder 120. The command decoder 120 can receive command signals from the command bus 122 and can decode the command signals to provide various internal commands. For example, the command decoder 120 can provide command signals to the internal clock generator 118 using an internal bus to coordinate generation of the phase-controlled, internal clock signal LCLK. In some examples, the phase-controlled, internal clock signal LCLK can be used to clock data through the input/output interface 106. In an example, a frequency of the internal clock signal CLK can be less than a frequency of a clock signal used by the memory controller 108 to communicate via the inter-device bus 110.

Data can be sent to and from the memory device 100 using the command and clocking signals discussed above, for example, by transmitting and receiving data signals through the input/output interface 106. More specifically, the data can be sent to or retrieved from the memory partitions 102 over a data path 130, such as can include multiple bidirectional data buses. Data I/O signals, for example, can be transmitted and received in one or more bidirectional data busses to and from the input/output interface 106. For particular memory devices, such as a DDR5 SDRAM memory device, the I/O signals can be divided into upper and lower bytes; however, such segmentation is generally not used for other memory device types.

Various other components such as power supply circuits (for receiving external VDD and VSS signals), read/write amplifiers (to amplify signals during read/write operations), temperature sensors (for sensing temperatures of the memory device 100), etc., can be incorporated with the memory device 100. Accordingly, it should be understood that the block diagram of FIG. 1 is only provided to highlight certain functional features of the memory device 100 to aid in the subsequent detailed description.

As mentioned earlier herein, the memory device 100 can use various internal clock signals. DRAM memory devices in particular use internal clock generator 118 (e.g., a DLL) to align the output data with the system clock. In some previous systems and designs, the clock frequency was slow enough that an incoming system clock signal was used to capture commands and addresses and was used as an input to the internal clock generator 118 to generate an output time on the rising or falling edge. However, as clock speeds increased, memory devices were unable to capture memory commands and addresses using the full frequency clock. Therefore, some memory systems can be adjusted for these faster speeds by generating multiple internal clock signals that toggle at half the frequency of the system clock. Commands and addresses can then be captured using either an "even" clock signal (e.g., CLKE) or an "odd" clock signal (e.g., CLKO) depending on which rising edge of the even or odd external clock signal such commands are aligned to. The even and odd clock signals can in turn be used by the internal clock generator 118 to generate output control clock signals. In effect, therefore, the timing of output bits can be controlled by two different clocks.

Figure 2:
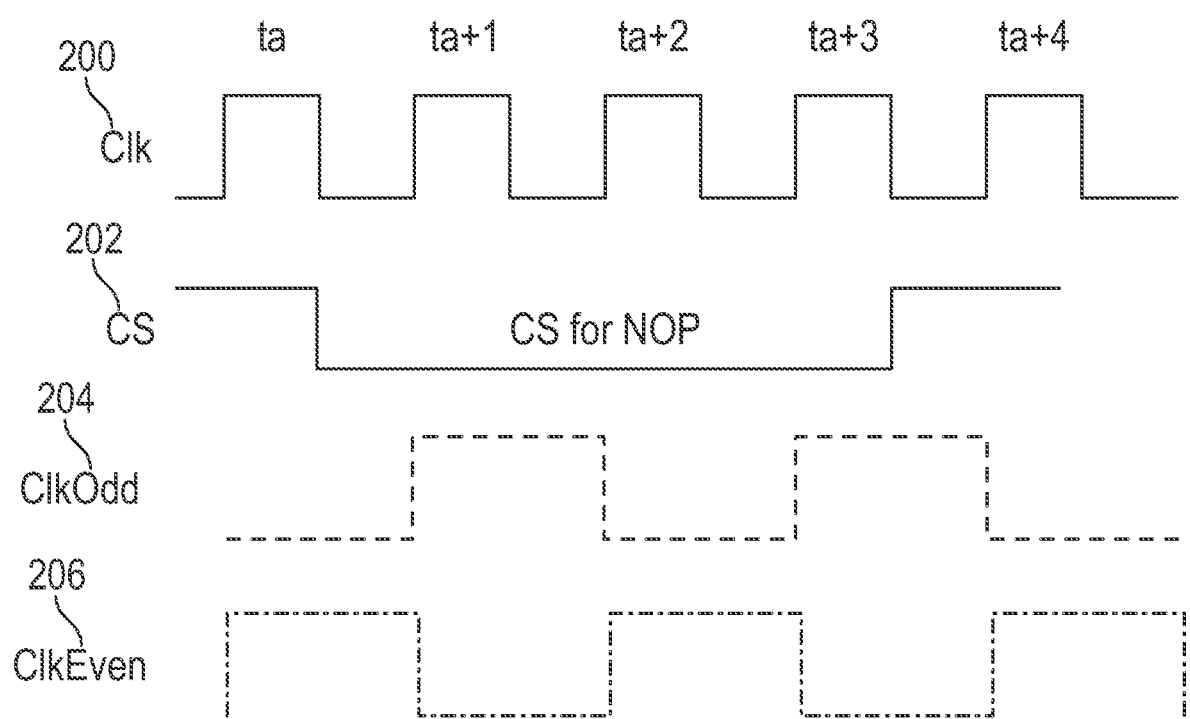
FIG. 2 illustrates generally a system clock signal and first and second internal clock signals for a memory device.

FIG. 2 illustrates generally a system clock signal and first and second internal clock signals, such as for use in a memory device. The example of FIG. 2 shows alignment of the rising edges of the first and second internal clock signals relative to edges of the external clock.

In the example of FIG. 2, an external clock signal is shown at external clock signal 200. A chip select (CS) signal for a command (in the example, no operation, or "NOP") is shown at signal 202. A first internal clock signal, having a rising edge at odd cycles of the external clock signal 200, is shown at first clock signal 204. A second internal clock signal, having a rising edge at even cycles of the external clock signal 200, is shown at second clock signal 206. A first clock signal 204 and the second clock signal 206 have a frequency that is half the frequency of the system clock 200.

The rising edge of the external clock signal 200 has a rising edge at either the rising edge of the first clock signal 204 or at the rising edge of the second clock signal 206, and external users may be unable to detect which of the internal signals' rising edge will coincide (e.g., map) with any given rising edge of the external clock signal 200. In some examples the first and second clock signal paths can be physically different paths, which in turn can affect edge timing and cause distortions or inconsistency in output data of the memory device 100.

To address these and other concerns, embodiments herein provide systems and methods to allow devices and users of the memory device 100 to map the external clock signal 200 to a particular internal divided clock signal (e.g., the first clock signal 204 or the second clock signal 206). In an example, external users and systems can read the output data, analyze the duty cycle and make an adjustment to the system clock to correct duty cycle distortion that can be caused by having an odd clock path and an even clock path.

Figure 3:
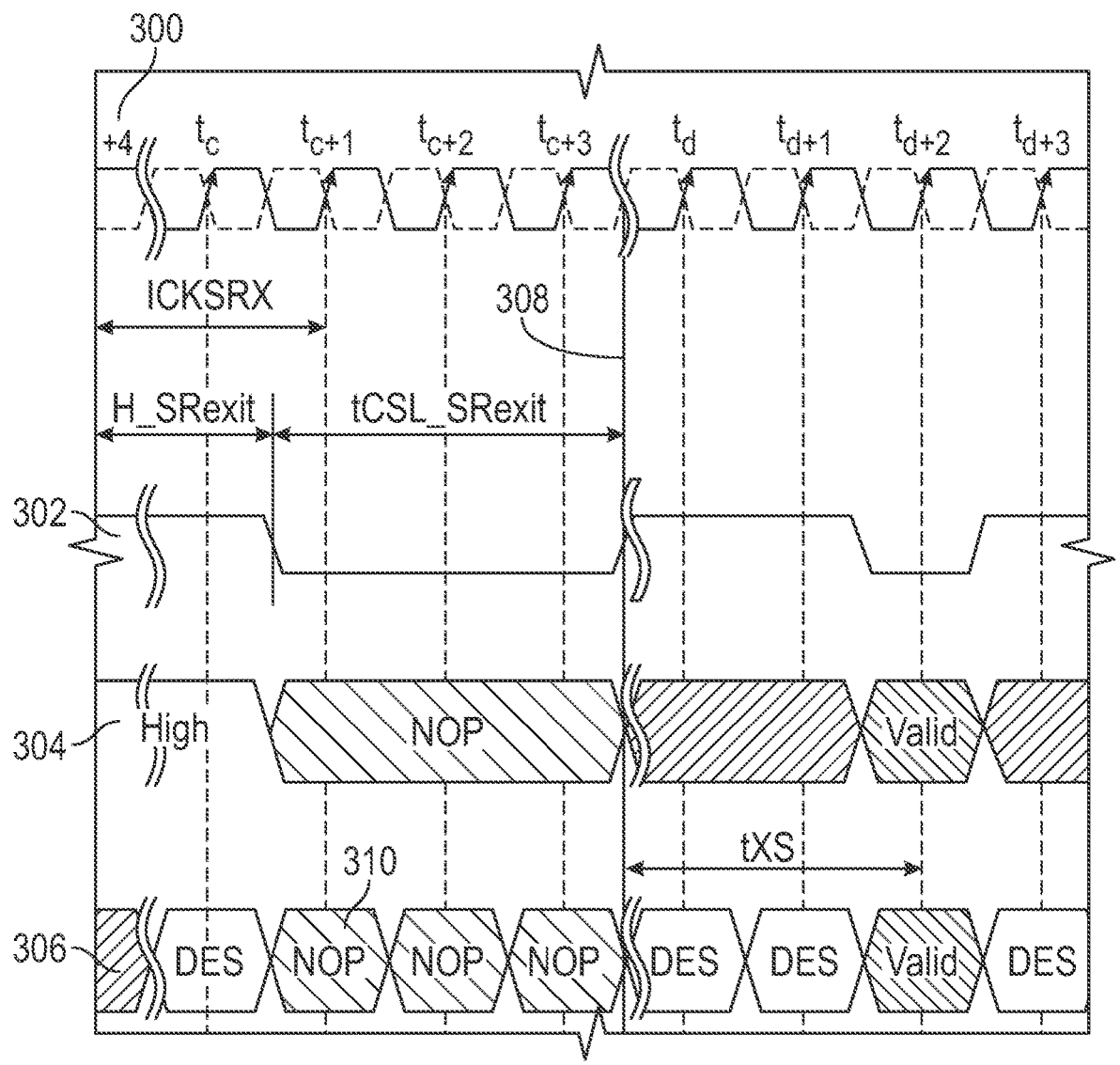
FIG. 3 illustrates generally an example of a signal diagram for a self-refresh exit operation.

FIG. 3 illustrates generally an example of a signal diagram for a self-refresh exit operation for a memory device. In the example of FIG. 3, the self-refresh exit operations can be used to determine or define an internal clock signal. The self-refresh exit operations and clock signal definitions can be performed prior to duty cycle adjuster (DCA) training described later herein. In some examples, self-refresh entry/self-refresh exit (SRE/SRX) operations are performed and, subsequent to the operations, the memory device 100 (or more specifically the memory controller 108) can align one of the clocks (e.g., the first clock signal 204 (FIG. 2)) with the first NOP issued for SRX as described below.

In the example of FIG. 3, signal 300 illustrates the external clock signal (e.g., similar to external clock signal 200 (FIG. 2)). Signal 302 is a chip select (CS) signal and signals 304 and 306 are command signals. A self-refresh operation is provided, and the self-refresh operation can include a self-refresh entry (SRE, not shown in FIG. 3) and a self-refresh exit (SRX) operation 308. In the example of FIG. 3, the self-refresh exit can comprise a string of three NOP commands 310 such as can be provided starting on a first odd clock cycle tc+1 of the external clock signal 300, which can correspond to the NOP command being mapped to a first command pipeline. Subsequent to this point, DCA training can be conducted. The chip select (CS) signal 302 is shown as low for three cycles corresponding to the string of three NOP commands 310. While a string of three NOP commands 310 is described, this is for example purposes only and embodiments are not limited thereto.

In an example, the first NOP command in the commands 310 can be detected in DRAM using detection circuitry. When the first NOP command is received, the NOP command arrives from a second (e.g., "even") command path or pipeline, or arrives from the first (e.g., "odd") command path or pipeline. The first command path and second command path can be identical or substantially identical but are based on clock signals shifted one half cycle from each other such that the clock signals are out of phase with each other.

In an example detection circuitry provides a detection result indicating whether the first NOP command (or other command associated with exit from the self-refresh operation) arrives on the first command pipeline or on the second command pipeline. If the NOP command arrives on the first command pipeline, then no clock swap adjustment is indicated, for example, because the first command pipeline can correspond to the NOP command being coincident with an "odd" cycle of the external clock (e.g., at tc+1). The example can then proceed with DCA training.

Otherwise, if the NOP command arrives on the second command pipeline, then a clock swap adjustment can be indicated, and a "clock swap" signal or indicator may be set for use in later processing as described herein. The example can then proceed with DCA training. In case of any subsequent SRE/SRX sequences, internal clocks can be mapped to what existed during the DCA training. If any subsequent "soft" resets occur, however, a pair of SRE/SRX commands can be issued to ensure the internal clocks are mapped as described above.

In an example, a clock swap operation can include the following. First, the external clock (e.g., external clock signal 200 (FIG. 2) or clock signal 300 (FIG. 3)) is divided using a clock divider into four phases (e.g., I (0 degrees), IB ((90 degrees phase shift relative to I), Q (180 degrees phase shift relative to I), and QB (270 degrees phase shift relative to I)). The output of the clock divider can be swapped when the "clock swap" signal is set, or "high," such as by reversing the outputs from the clock divider. When the outputs are reversed, instead of outputting the I phase, the Q phase is output; similarly, instead of outputting IB, QB is output. A multiplexer (mux) can be used for the swapping, as provided in a circuit diagram later herein.

Referring again to FIG. 2, FIG. 2 illustrates the NOP command occurs (e.g., when the CS signal 202 is asserted) in coordination with a rising edge of the first clock signal 204. In this example, no "clock swapping" is indicated.

Figure 4:
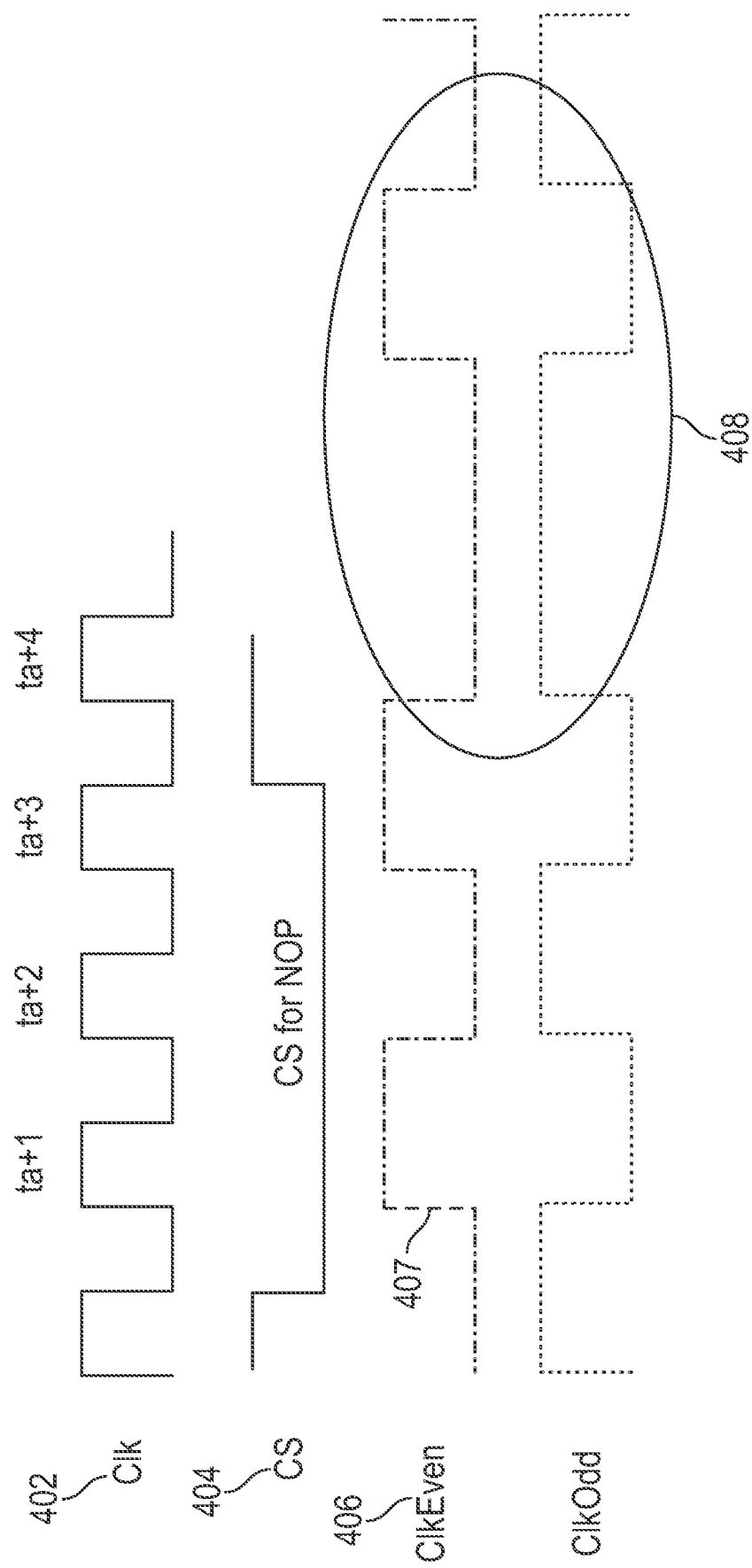
FIG. 4 illustrates generally an example of a clock signal swap.

In contrast, FIG. 4 illustrates clock swapping in accordance with some embodiments. In the example, an external clock signal 402 is provided. When the NOP command occurs (e.g., when the CS signal 404 is asserted), the clock signal with a corresponding rising edge can be the second (e.g., "even") clock signal 406, as shown at point 407. Accordingly, the clocks can be swapped at 408, for example by delaying edges of each of the even and odd clock signals by one full system (external) clock cycle. In an example, the delay can be achieved by "swapping" (I, Q) and (IB, QB) phases in pairs.

Figure 5:
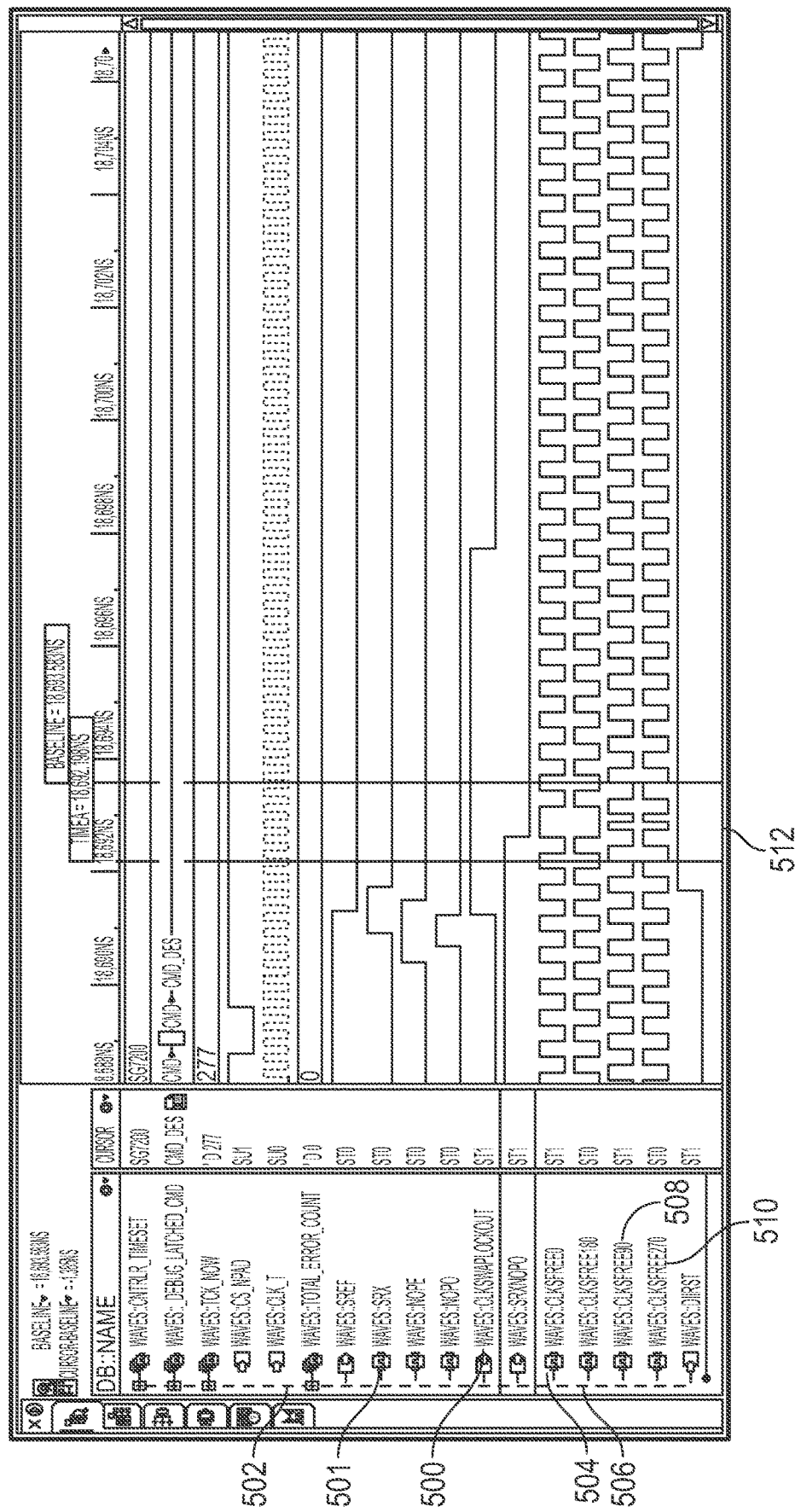
FIG. 5 illustrates generally a signal diagram including command lockout signals and clock swap signals.

FIG. 5 illustrates generally a signal diagram including command lockout signals and clock swap signals. In examples in which clock signals are swapped, a command-decode lockout signal 500 can be generated in coordination with the clock swap event. The lockout signal 500 can be used to enforce a lockout window 512, or interval during which no operations or commands are executed, such as to protect circuitry that could be adversely affected by the irregular clock signal pattern(s) during the clock swap event. For example, adjacent flipflops (not shown in FIG. 5) or other adjacent elements connected to or controlled by the divided clock signals during the "swap" event can be inhibited from carrying out operations during the lockout window.

In the example of FIG. 5, a self-refresh exit (SRX) command is received at signal 501. An external clock is shown at signal 502. The four phase signals of the first and second internal clocks are shown at 504 (I phase, or 0 degrees), 506 (Q phase, or 180 degrees), 508 (IB phase, or 90 degrees), and 510 (QB phase, or 270 degrees). The lockout signal 500 goes high, or is enabled, while the swapping occurs at the lockout window 512, during which signals 504 and 506 are swapped, and signals 508 and 510 are swapped.

Figure 6B:
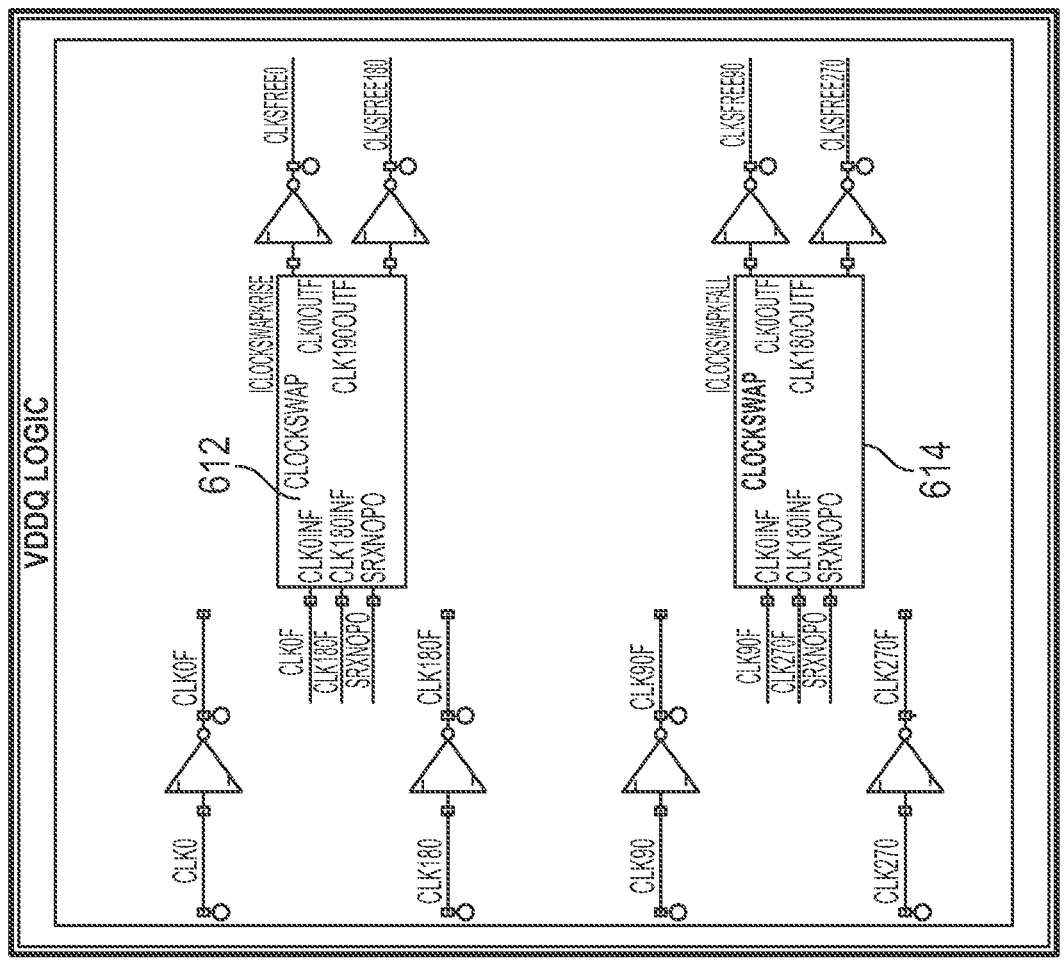
FIG. 6B illustrates generally an example of clock swap circuitry and control logic.
Figure 6A:
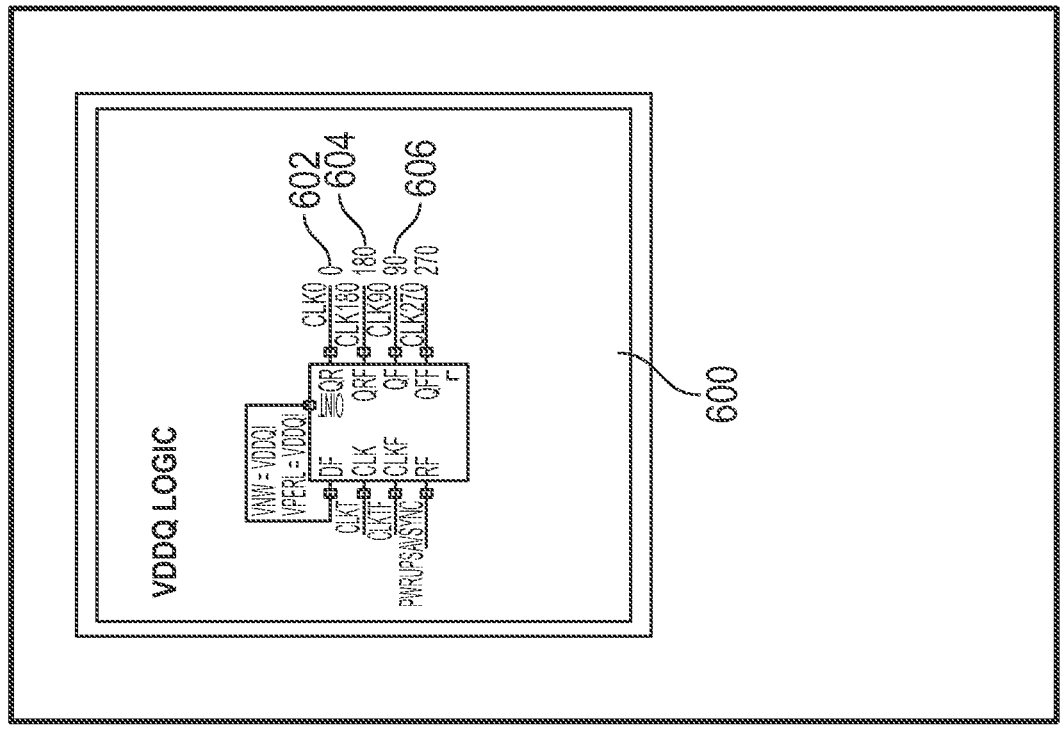
FIG. 6A illustrates generally an example of clock divider circuitry.

FIG. 6A illustrates generally an example of clock divider circuitry 600. In the example, four signals are provided, each separated by a phase or number of degrees, e.g., 90 degrees or a portion of a clock cycle. Pin 602 provides the I phase, or 0 degrees, pin 604 provides Q phase, or 180 degrees, pin 606 provides IB phase, or 90 degrees, and pin 608 provides QB phase, or 270 degrees). The different phase signals are provided based on a system clock signal, CLKT.

FIG. 6B illustrates generally an example of clock swap circuitry and control logic. The example includes a clock swap circuit 612 that can provide signal swapping if indicated for I phase and Q phase signals. The clock swap circuit 614 can provide signal swapping if indicated for IB phase and QB phase signals.

Figure 6C:
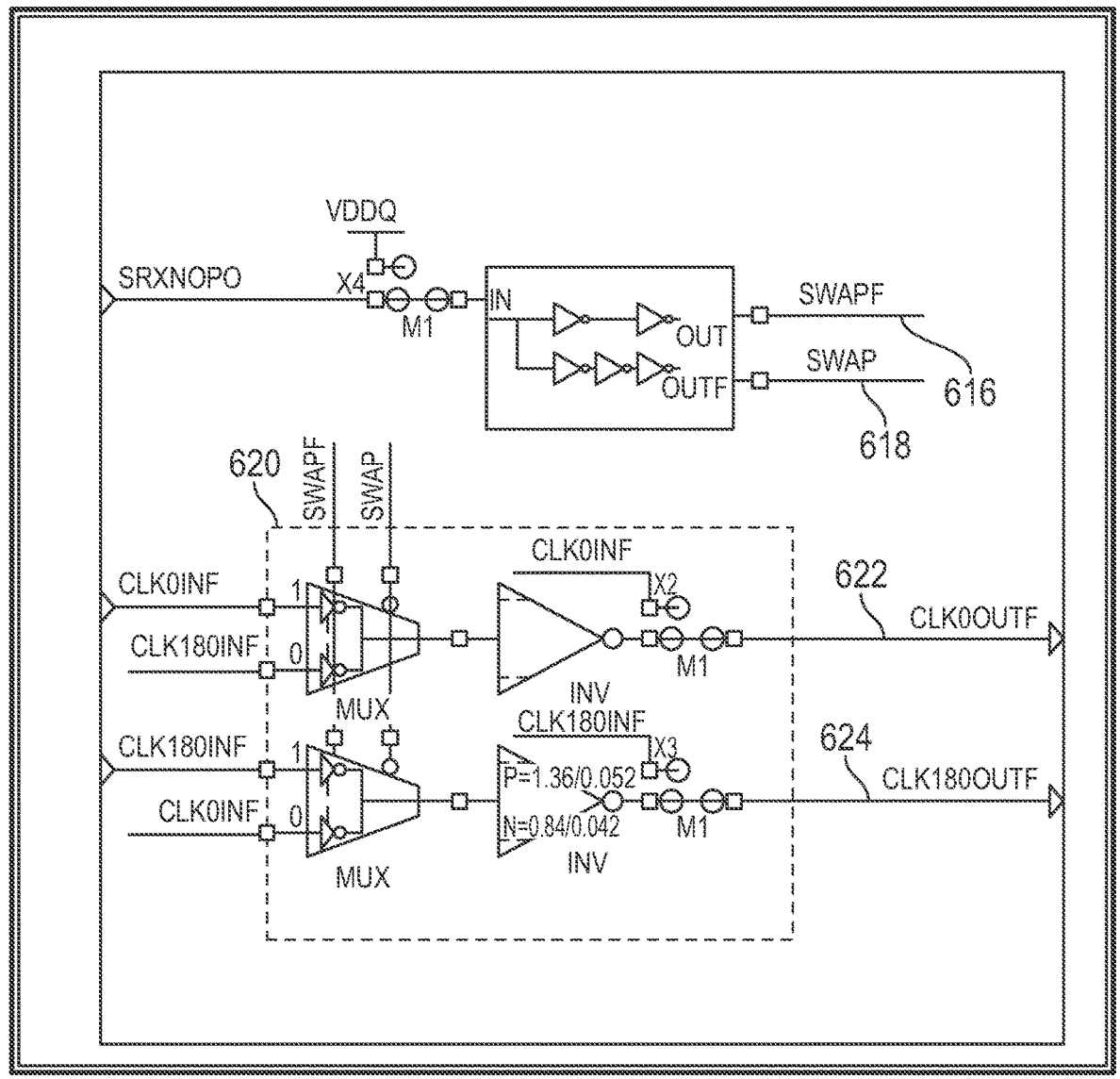
FIG. 6C illustrates generally an example of clock swap circuitry.

FIG. 6C illustrates generally an example of clock swap circuitry. In an example, FIG. 6C provides further detail regarding clock swap circuitry in accordance with some embodiments. For example, swap 616, if high, indicates that swapping should not occur, and swap signal 618, if high, indicates that swapping should occur. The circuit in box 620 comprises a multiplexer (mux) for performing signal swap operations and is configured to provide an output that includes a pair of internal clock signals 622 and 624 that can be swapped signals or original, non-swapped signals.

Figure 7A:
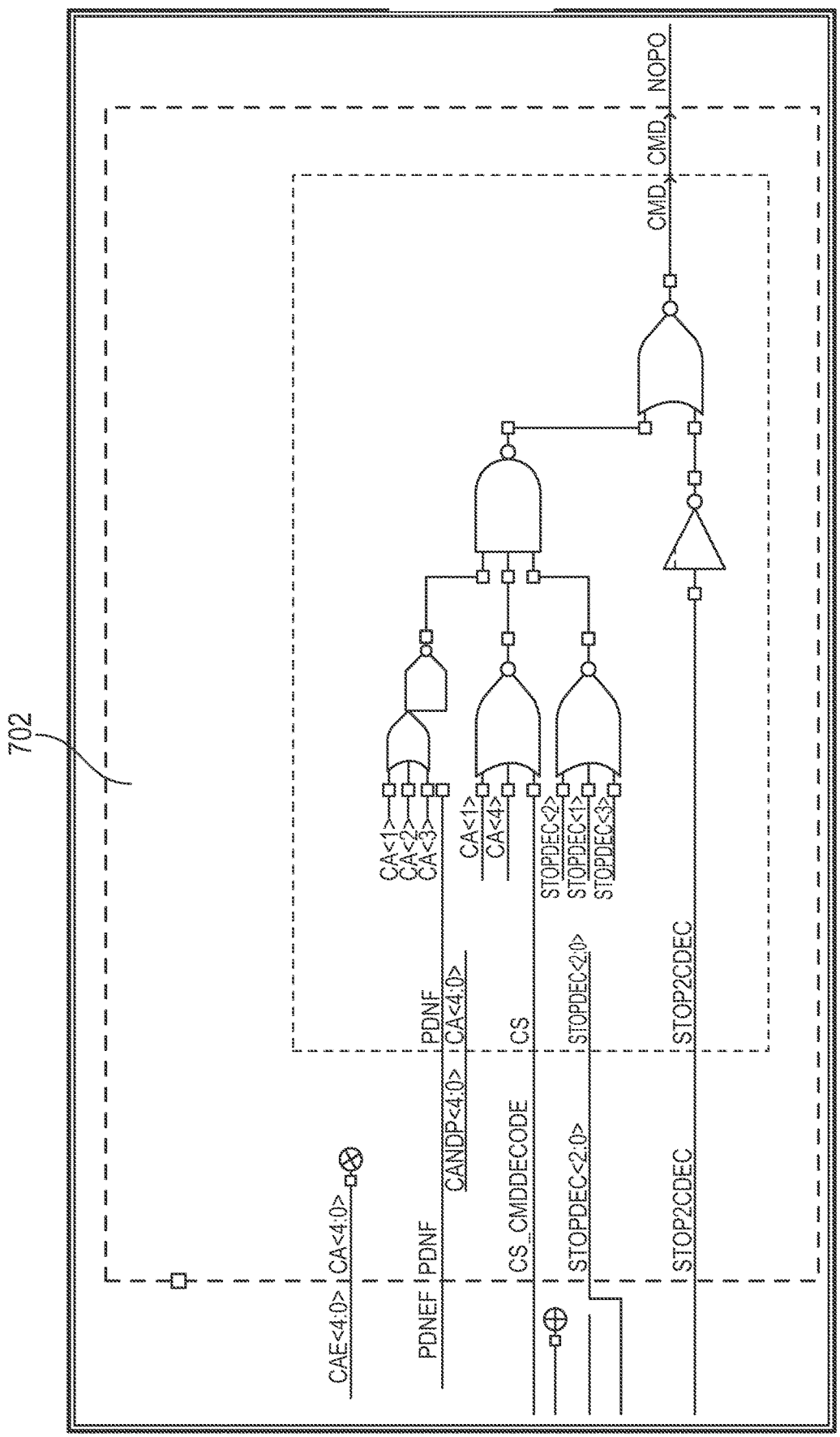
FIGS. 7A and 7B illustrate generally examples of a portion of command decode circuitry.
Figure 7A:
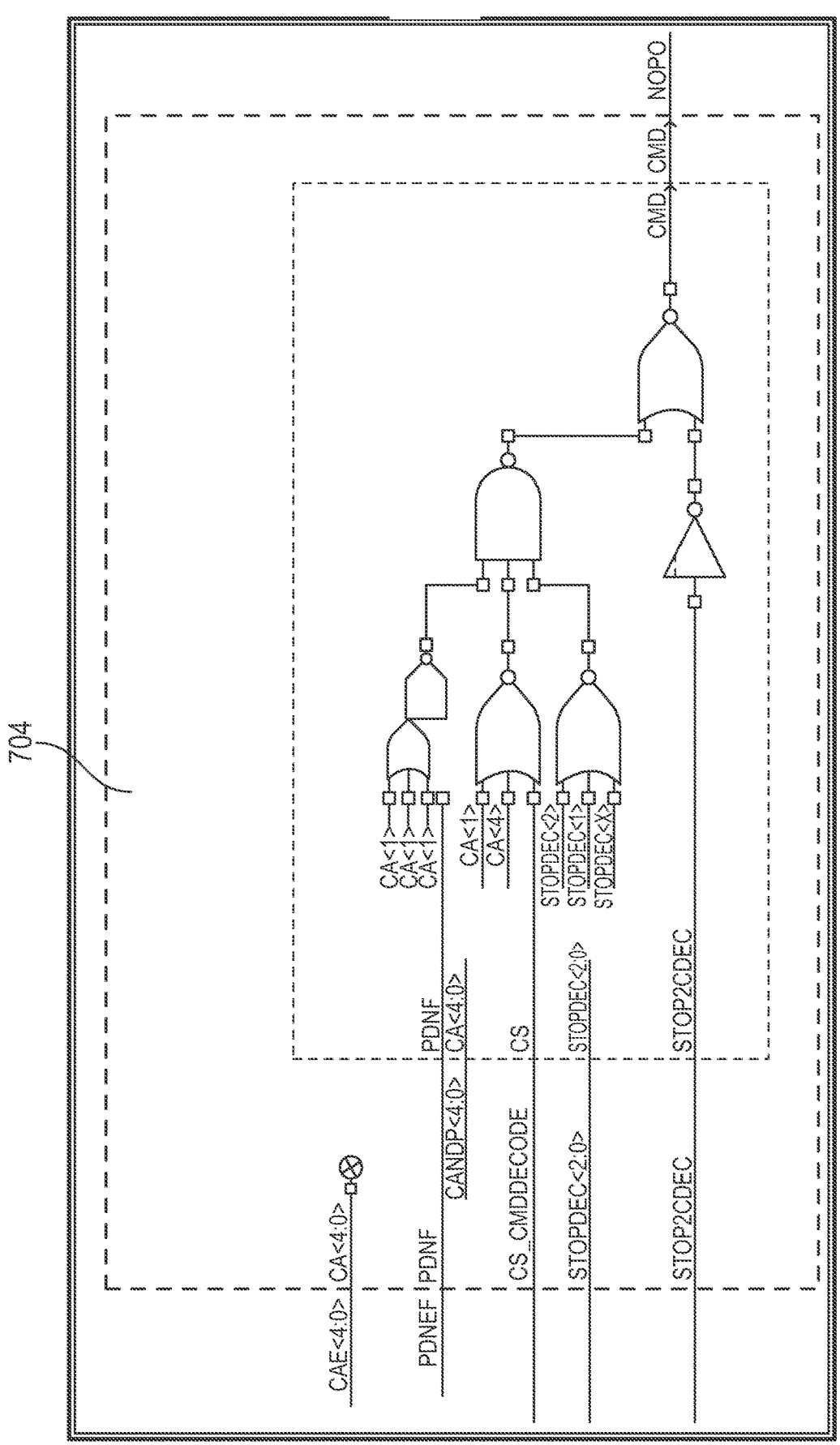
Figure 7A:
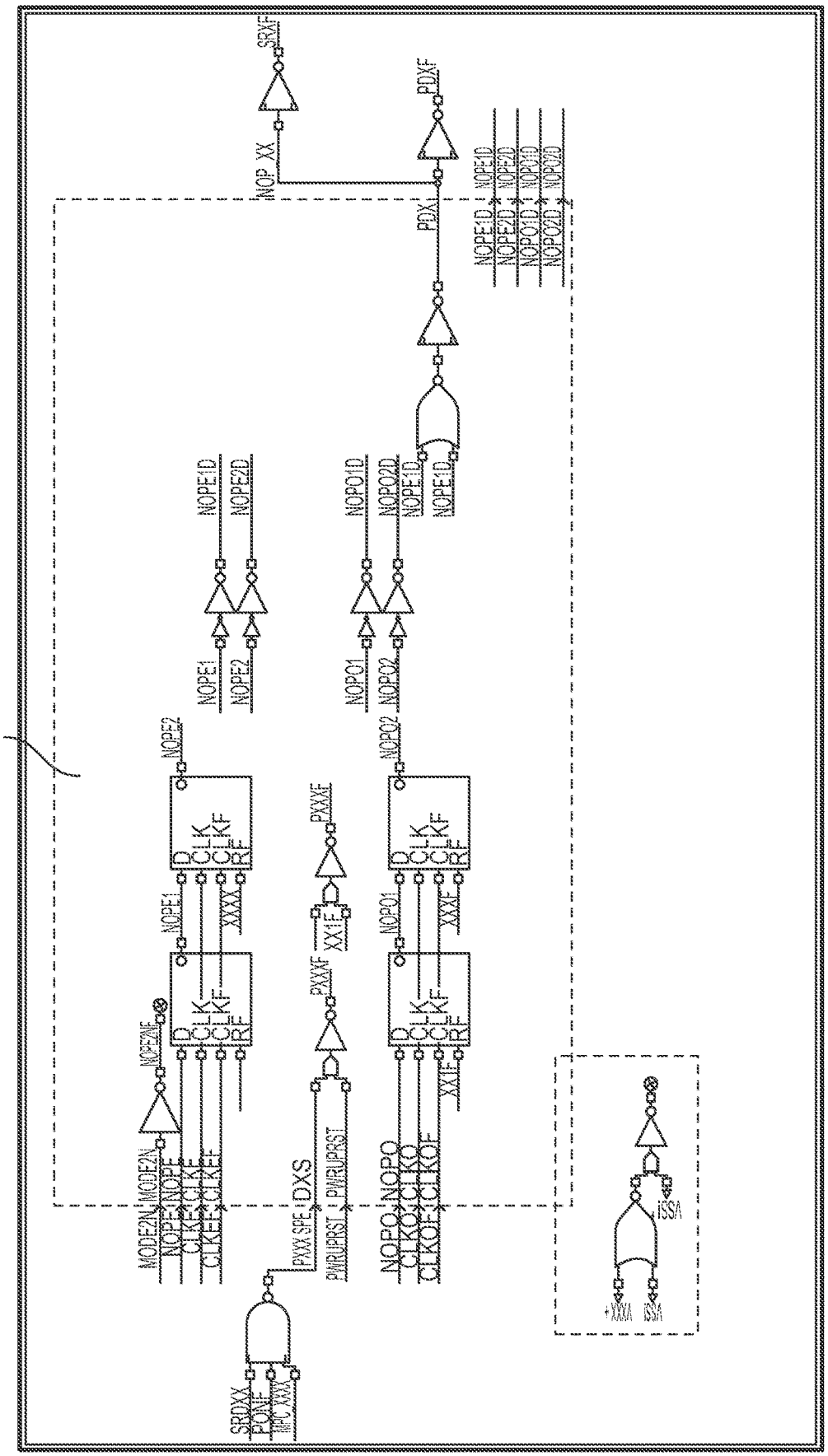
Figure 7B:
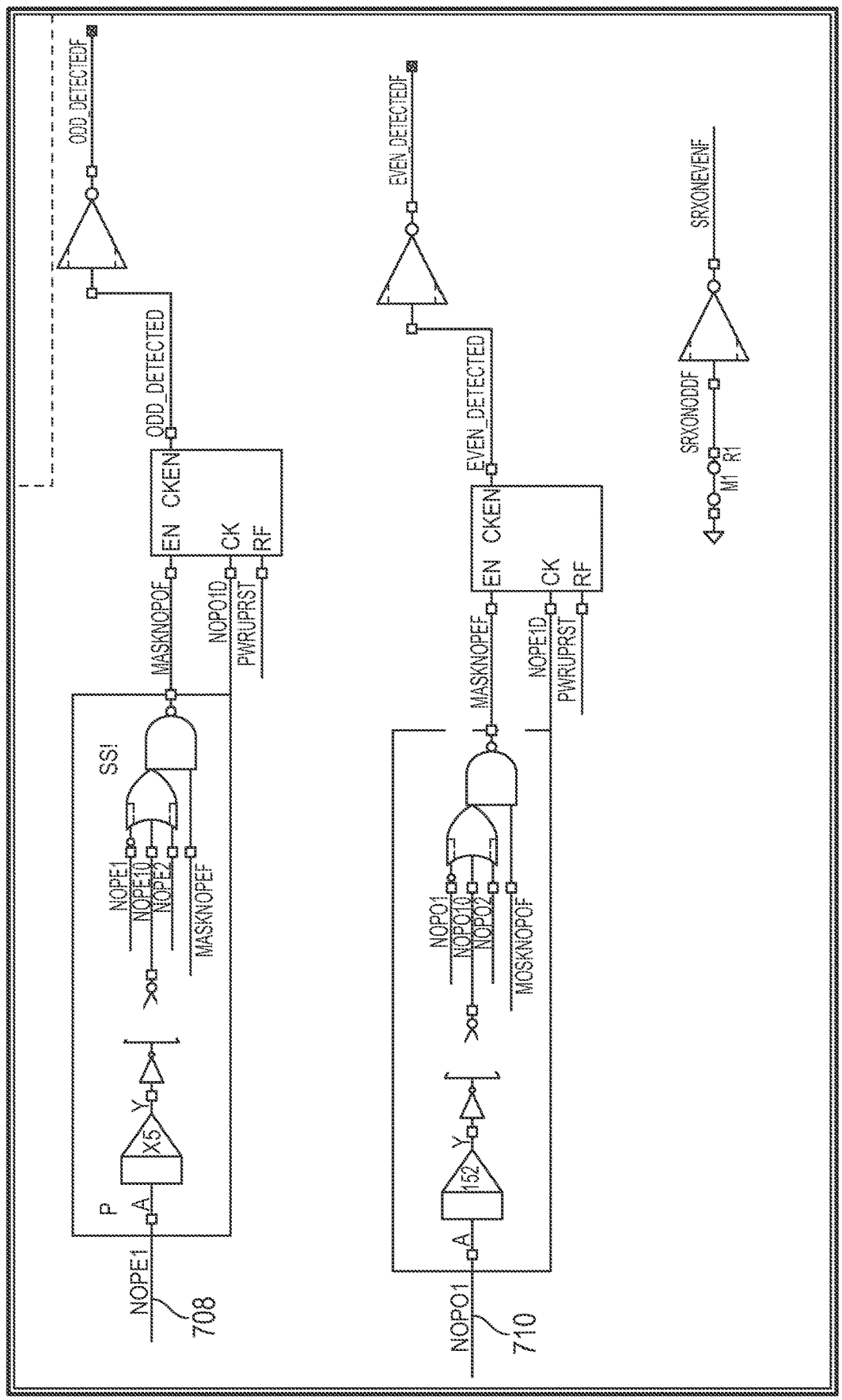
Figure 7B:
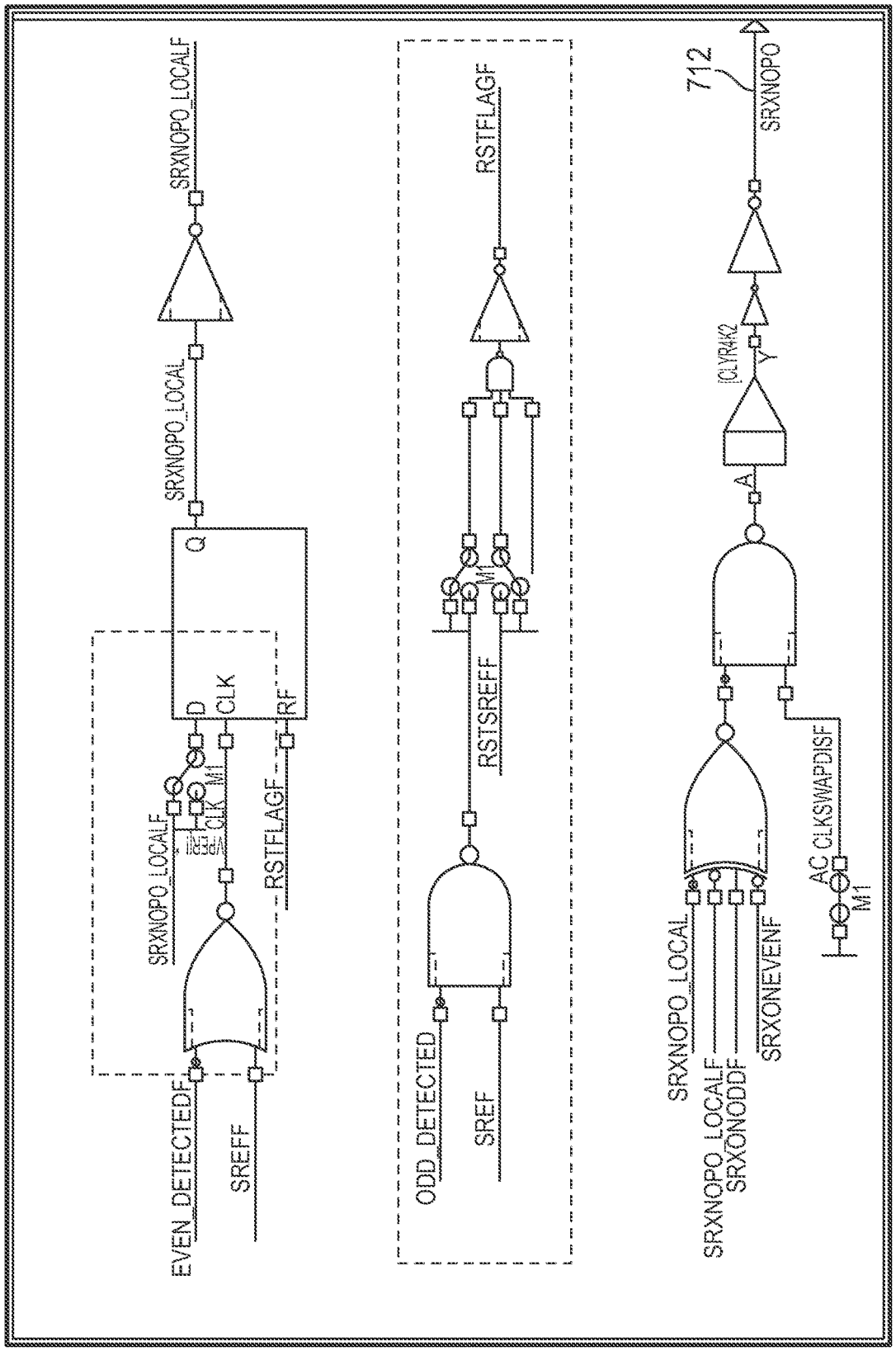

FIG. 7A and FIG. 7B illustrate generally examples of a portion of command decode circuitry. The decode circuitry can be configured to identify a NOP command (e.g., such as can be associated with a self-refresh entry and/or exit operation) on first and second command paths. In the example, block 702 includes an even decoder configured to detect commands arriving via a second (or "even") pipeline. For example, block 702 can include circuitry configured to identify NOP commands on the second command pipeline and provide an output signal or NOPE command when one or more NOP commands are identified in the second command pipeline. In the example, block 704 includes an odd decoder configured to detect commands arriving via a first (or "odd") pipeline. For example, block 704 can include circuitry configured to identify NOP commands on the first command pipeline and provide an output signal or NOPO command when one or more NOP commands are identified in the first command pipeline. In an example, blocks 702 and 704 can comprise different instances of the same circuit but applied to different pipelines.

In the example of FIG. 7A, block 706 includes command decoder circuitry configured to monitor or capture NOP command information about the first and second pipelines and monitor or capture information about a self-refresh exit (SRX)) command. For example, receipt of an exit command can have the same or similar effect as a NOP command in triggering a clock swap detection and/or implementation event. In an example, block 706 includes logic configured to identify whether multiple NOP commands were received. In some examples, a clock swap can be inhibited unless or until a specified number of discrete NOP commands is received (e.g., three consecutive NOP commands in a particular pipeline).

In FIG. 7B, the illustrated portion of the command decode circuitry can be configured to detect on which of the first and second command pipelines a NOP command arrives first or earliest. Based on the detection result about the self-refresh exit NOP command signal, a signal can be generated that indicates whether clocks need to be swapped in accordance with various embodiments.

In an example, the input channel 708/710 pair is coupled to arbiter circuitry that detects the pipeline that carries the first NOP command of the SRX routine. The input channel 708/710 pair can be configured to receive output signals from, e.g., the portion of the decoder circuitry illustrated in the examples of blocks 702 and 704, respectively, such as the NOPE and NOPO commands. The arbiter circuitry can, for example, mask the NOPE command when the NOPO command is captured earlier, or can mask the NOPO command when the NOPE command is captured earlier. In the example of FIG. 7B, a clock swap indicator signal 712 can be toggled according to a detection result that indicates whether a clock swap is required.

Figure 8A:
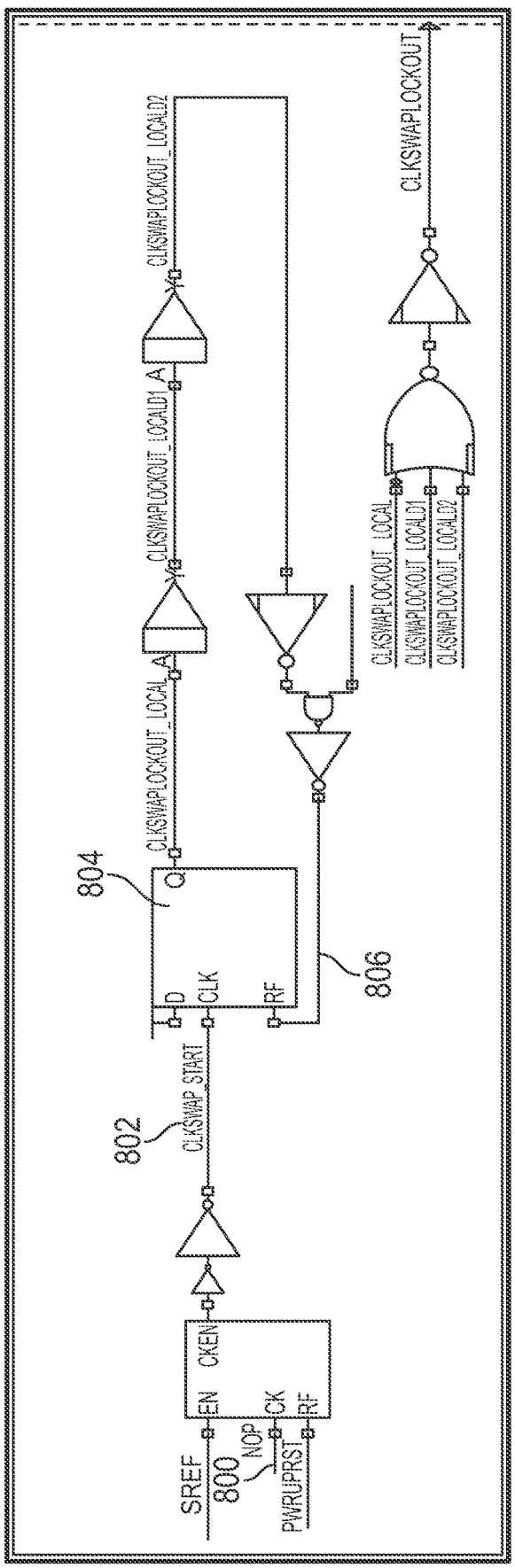
FIG. 8A illustrates generally an example of command lockout timing circuitry.

FIG. 8A illustrates generally an example of command lockout timing circuitry. At an input of the lockout timing circuitry, the circuitry can be configured to receive self-refresh, NOP, and/or power-up reset signals. In response, the circuitry can provide a CLKSWAP_START signal to set a flip flop 804. The output of the flip flop can be processed or delayed (e.g., using one or multiple signal delay elements) and can feed back to the flip flop 804 via a feedback path 806, thereby forming a timeout mechanism. The timeout can be configured such that the signal flow will settle to a final state within a specified command lockout window, such as corresponding to a particular number of clock cycles. The lockout window can have a sufficient duration or interval length such that a clock-swap event can complete. In an example, a power-up reset signal can be introduced at an intermediate portion of the feedback path 806 to bypass some or all of the delay elements.

Figure 8B:
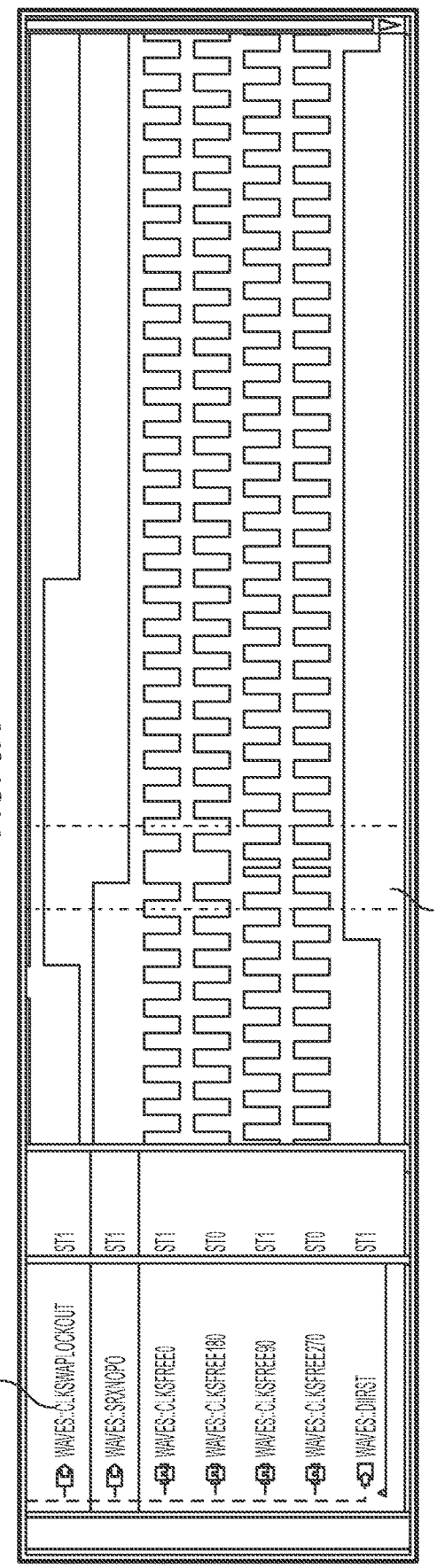
FIG. 8B illustrates generally a signal diagram including a command lockout window.

FIG. 8B illustrates generally a signal diagram including a command lockout window. In the example of FIG. 8B, a command lockout window can be triggered at 810 such as in coordination with a self-refresh entry, or initiation of a self-refresh routine. In the example, a clock swap event can occur during a lockout window 812. Irregular clock signals during the clock swap event can lead to erroneous commands, and therefore commands that arrive during the clock swap event can be intentionally paused or discarded, such as during the lockout window 812. In an example, a number of cycles used to carry out the clock swap can be less than a number of cycles in the lockout window 812. After the self-refresh routine completes, the internal clock generator 118 (e.g., DLL, shown in FIG. 1) can be reset and then re-locked.

Figure 9:
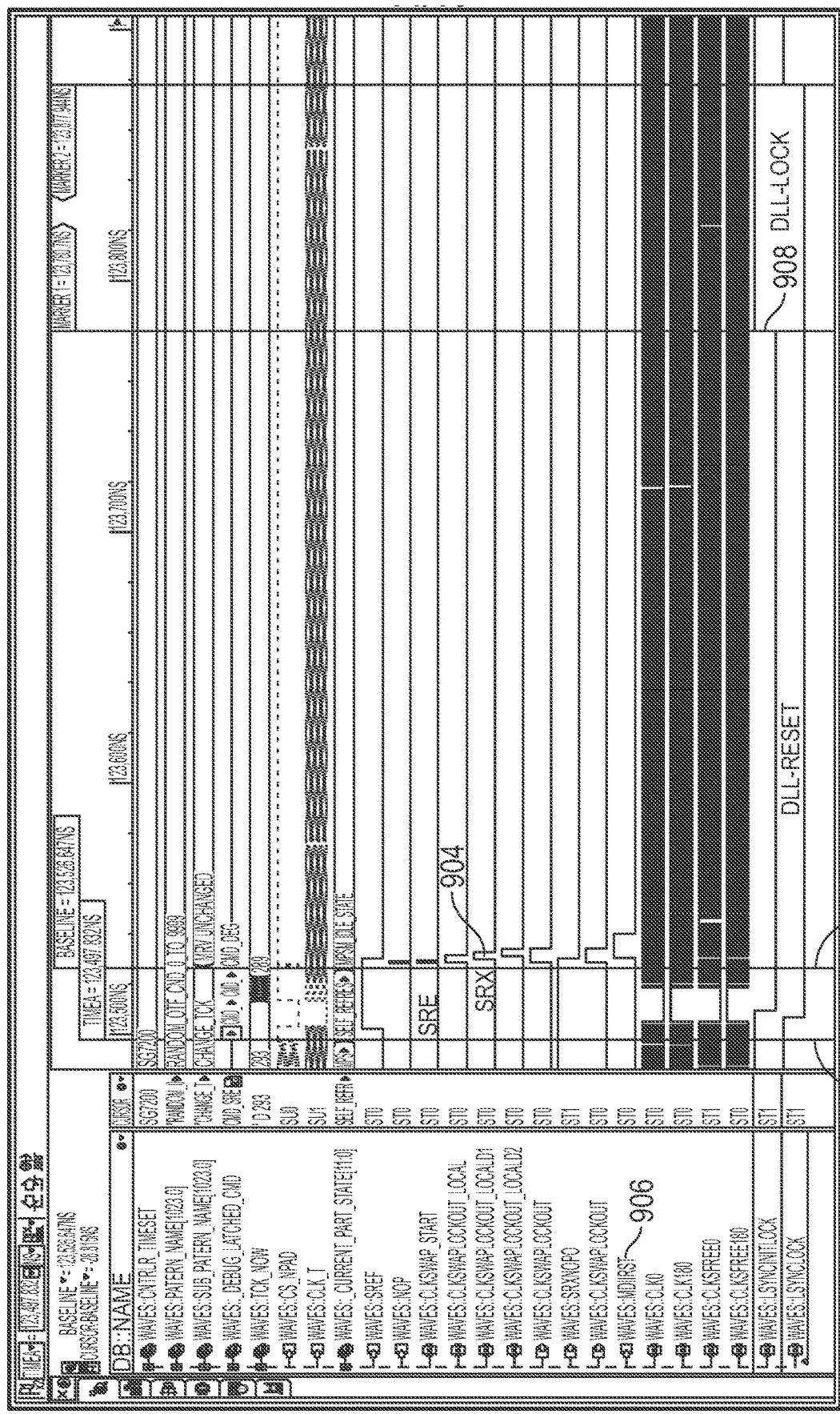
FIG. 9 illustrates generally a signal diagram including an example of a delay locked loop (DLL) reset after a self-refresh event.

FIG. 9 illustrates generally a signal diagram including an example of a delay locked loop (DLL) reset after a self-refresh event. In an example, a self-refresh routine can initiate at time 900 (e.g., at SRE) and the self-refresh routine can end at time 902 (e.g., at SRX). In an example, during some portion of the self-refresh routine, clock sync (e.g., with a system clock) can be lost and can be later reestablished, such as following the self-refresh routine. In the example of FIG. 9, a clock swap event 904 can be initiated at or in coordination with a self-refresh exit command A DLL reset command signal 906 can be asserted (e.g., following the self-refresh exit) and the clock signals can be re-synchronized. For example, a DLL reset interval can begin in coordination with the self-refresh exit routine. A coarse lock can be established over a number of clock cycles (e.g., generally a number of clock cycles that exceeds the number of cycles used for the self-refresh routine and/or for the clock swap event). At time 908, a DLL lock can be achieved, and the system can continue with normal command processing operations.

According to various examples, clock swap events can be performed at an earliest possible logic point, such as at or shortly after receipt of a system clock signal (e.g., in a memory chip). Downstream circuits, such as including the internal clock generator 118, can then receive and use the correctly-aligned clock signals that are output from the clock-swap circuit.

Figure 10:
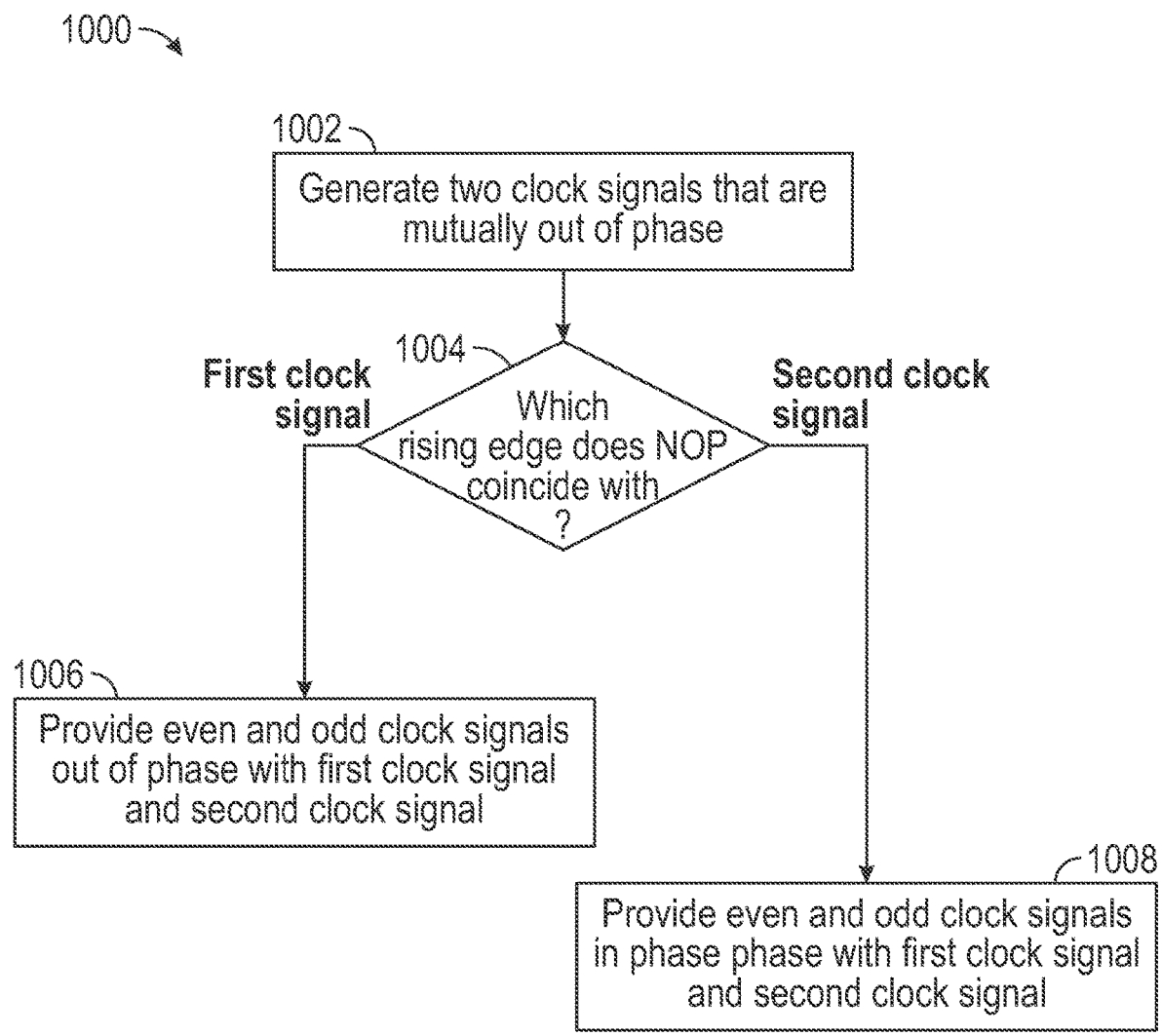
FIG. 10 illustrates generally an example of a method for using NOP signal detection to determine a clock signal timing.

FIG. 10 illustrates generally an example of a method 1000 for using NOP command signal detection to determine a clock signal timing. In the method 1000, internal clock signals can be provided, such as using the internal clock generator 118 (e.g., DLL) circuitry to align output data with a system clock. At operation 1002, the method 1000 includes generating a first clock signal and a second clock signal based on a system clock signal. In an example, the first and second clock signals can be mutually out of phase.

At decision operation 1004, the method 1000 can include determining whether an initial operation of a self-refresh exit operation coincides with a rising edge of the first clock signal or the second clock signal. In an example, the initial operation of the self-refresh exit operation can include a no operation (NOP) command, or a series of multiple, time-adjacent NOP commands on one or more respective command busses, such as in a memory device. In an example, operation 1004 can be understood with reference to FIG. 3 that illustrates that the command associated with exiting from a self-refresh operation can comprise NOP command 306, although embodiments are not limited to NOP commands In an example, NOP command detection can be performed using various command detection circuitry, such as using the circuitry described herein at least with reference to FIGS. 6A and 6B. In an example, the NOP command detection circuitry can be configured to provide a detection result, such as can include a signal with information about whether the initial operation of the self-refresh exit operation coincides with the rising edge of the first or second clock signal.

If, at decision operation 1004, the NOP command coincides with a rising edge of the first clock signal (e.g., corresponding to a first command pipeline), then the method 1000 can continue with operation 1006. In, at decision operation 1004, the NOP command coincides with a rising edge of the second clock signal (e.g., corresponding to a second command pipeline), then the method 1000 can continue with operation 1008.

In the example of the method 1000, the detection result can be used to toggle behavior of a clock swap circuit. The clock swap circuit can receive the detection result and the first and second clock signals and, in response, can provide an odd clock signal and an even clock signal corresponding to the first and second clock signals, respectively. The timing or phase of the odd and even clock signals can depend on the value of the detection result. For example, at operation 1006, the method 1000 can include providing even and odd clock signals that are out of phase with the first and second clock signals, respectively. At operation 1008, the method 1000 can include providing even and odd clock signals that are in phase with the first and second clock signals, respectively.

Figure 11:
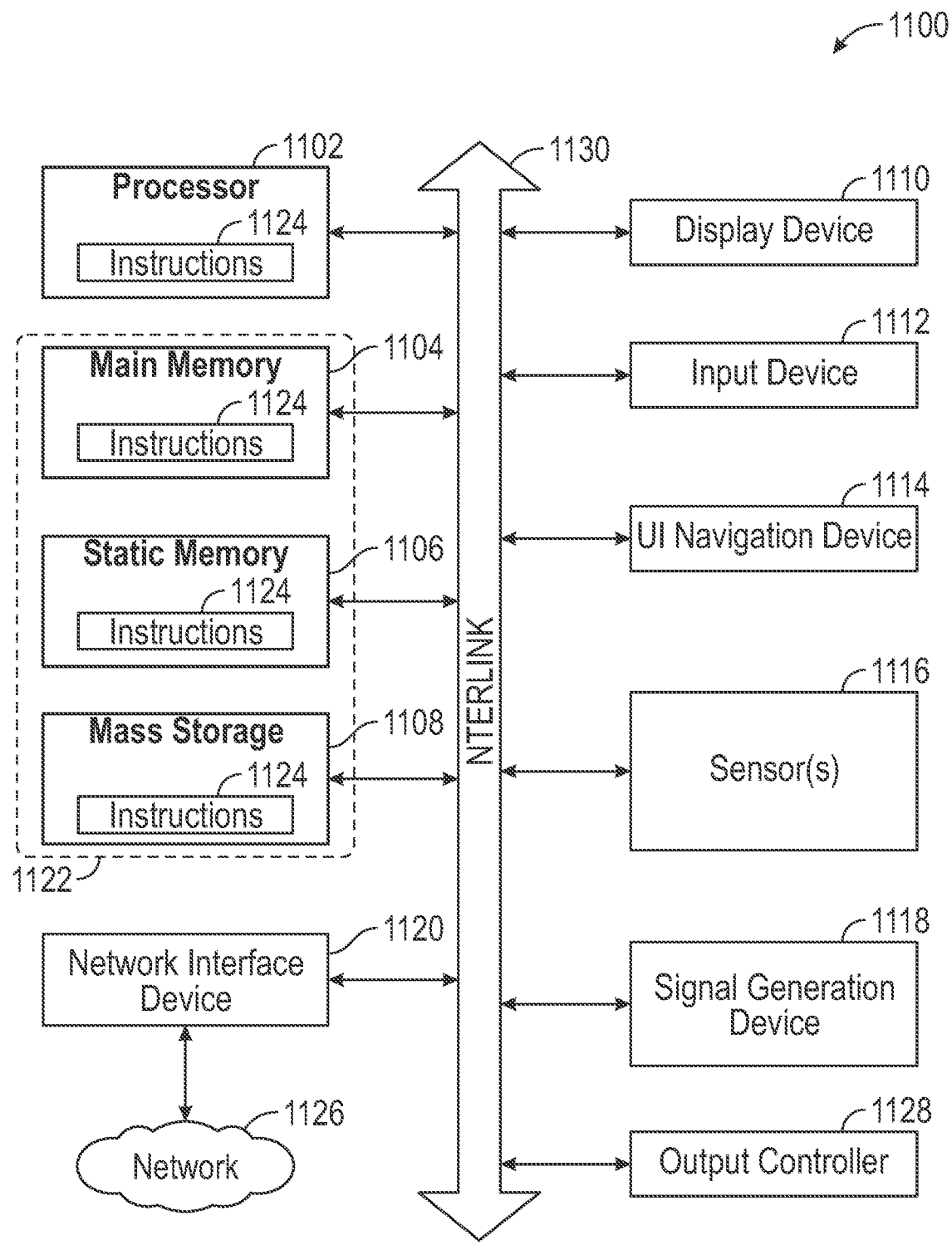
FIG. 11 illustrates a block diagram of an example machine with which, in which, or by which any one or more of the techniques discussed herein can be implemented.

FIG. 11 illustrates a block diagram of an example machine (e.g., a host system) 1100 which may include one or more memory devices and/or memory systems, such as can include or use clock swap circuitry as described herein. The machine 1100 may benefit from enhanced memory performance from use of one or more of the described memory devices and/or memory systems, facilitating improved performance of the machine 1100 (as for many such machines or systems, efficient reading and writing of memory can facilitate improved performance of a processor or other components that machine), as described further below.

In alternative embodiments, the machine 1100 may operate as a standalone device or may be connected (e.g., networked) to other machines. In a networked deployment, the machine 1100 may operate in the capacity of a server machine, a client machine, or both in server-client network environments. In an example, the machine 1100 may act as a peer machine in peer-to-peer (P2P) (or other distributed) network environment. The machine 1100 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 1100 may include a processing device 1102 (e.g., a hardware processor, a central processing unit (CPU), a graphics processing unit (GPU), a hardware processor core, or any combination thereof, etc.), a main memory 1104 (e.g., read-only memory (ROM), dynamic random-access memory (DRAM) such as synchronous DRAM (SDRAM) or Rambus DRAM (RDRAM), etc.), a static memory 1106 (e.g., static random-access memory (SRAM), etc.), and a storage system 1108, some or all of which may communicate with each other via a communication interface (e.g., a bus) 1130. In one example, the main memory 1104 includes one or more memory devices as described in examples above.

The processing device 1102 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 1102 can also be one or more special-purpose processing devices such as an application specific integrated circuit (ASIC), a field programmable gate array (FPGA), a digital signal processor (DSP), network processor, or the like. The processing device 1102 can be configured to execute instructions 1124 for performing the operations and steps discussed herein. The computer system 1100 can further include a network interface device 1120 to communicate over a network 1126.

The storage system 1108 can include a machine-readable storage medium (also known as a computer-readable medium) on which is stored one or more sets of instructions 1124 or software embodying any one or more of the methodologies or functions described herein. The instructions 1124 can also reside, completely or at least partially, within the main memory 1104 or within the processing device 1102 during execution thereof by the computer system 1100, the main memory 1104 and the processing device 1102 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with multiple particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 1100 may further include a display unit, 1110, an alphanumeric input device 1112 (e.g., a keyboard), and a user interface (UI) navigation device 1114 (e.g., a mouse). In an example, one or more of the display units, the input device, or the UI navigation device may be a touch screen display. The machine a signal generation device 1118 (e.g., a speaker), or one or more sensors 1116, such as a global positioning system (GPS) sensor, compass, accelerometer, or one or more other sensor. The machine 1100 may include an output controller 1128, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 1124 (e.g., software, programs, an operating system (OS), etc.) or other data are stored on the storage system 1108 can be accessed by the main memory 1104 for use by the processing device 1102. The main memory 1104 (e.g., DRAM) is typically fast, but volatile, and thus a different type of storage than the storage system 1108 (e.g., an SSD), which is suitable for long-term storage, including while in an "off" condition. The instructions 1124 or data in use by a user or the machine 1100 are typically loaded in the main memory 1104 for use by the processing device 1102. When the main memory 1104 is full, virtual space from the storage system 1108 can be allocated to supplement the main memory 1104; however, because the storage system 1108 device is typically slower than the main memory 1104, and write speeds are typically at least twice as slow as read speeds, use of virtual memory can greatly reduce user experience due to storage system latency (in contrast to the main memory 1104, e.g., DRAM). Further, use of the storage system 1108 for virtual memory can greatly reduce the usable lifespan of the storage system 1108.

The instructions 1124 may further be transmitted or received over a network 1126 using a transmission medium via the network interface device 1120 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 1102.15 family of standards known as Wi-Fi®, IEEE 802.16 family of standards known as WiMax®), IEEE 802.15.4 family of standards, peer-to-peer (P2P) networks, among others. In an example, the network interface device 1120 may include one or more physical jacks (e.g., Ethernet, coaxial, or phone jacks) or one or more antennas to connect to the network 1126. In an example, the network interface device 1108 may include multiple antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 1100, and includes digital or analog communications signals or other intangible medium to facilitate communication of such software.

To better illustrate the methods and apparatuses described herein, a non-limiting set of Example embodiments are set forth below as numerically identified Examples.

Example 1 includes an apparatus comprising clock circuitry configured to generate a first clock signal and a second clock signal based on a system clock signal, the first clock signal and the second clock signal being mutually out of phase, and detection circuitry configured to provide a detection result indicating whether an initial operation of a self-refresh exit operation coincides with a rising edge of the first clock signal or a rising edge of the second clock signal. Example 1 can further include processing circuitry configured to receive the first clock signal and the second clock signal and the detection result and, in response, provide an odd clock signal and an even clock signal corresponding to the first clock signal and the second clock signal, respectively, and provide the odd clock signal and the even clock signal out of phase with the first clock signal and the second clock signal when the detection result coincides with the rising edge of the first clock signal, and to provide the odd clock signal and the even clock signal in phase with the first clock signal and the second clock signal when the detection result coincides with the rising edge of the second clock signal.

In Example 2, the subject matter of Example 1 can include or use duty cycle adjustment (DCA) circuitry configured to change a duty cycle characteristic of at least one of the first clock signal and the second clock signal.

In Example 3, the subject matter of any one or more of Examples 1-2 can include the odd clock signal and the even clock signal each at a frequency of about one half the frequency of the system clock signal of the apparatus and 180 degrees out of phase with each other.

In Example 4, the subject matter of any one or more of Examples 1-3 can include or use a command processor configured to process commands for the apparatus based on instructions on a command bus, and the command processor can be configured to initiate a command lockout for commands on the command bus in coordination with the self-refresh exit operation.

In Example 5, the subject matter of any one or more of Examples 1-4 can include providing the odd clock signal and the even clock signal out of phase with the first clock signal comprises swapping outputs of clock divider pairs.

In Example 6, the subject matter of any one or more of Examples 1-5 can include the self-refresh exit operation including a self-refresh entry (SRE) command and a self-refresh exit (SRX).

In Example 7, the subject matter of Example 6 can include the initial operation of the self-refresh exit operation including a No Operation (NOP) command or a string of multiple NOP commands in sequence.

In Example 8, the subject matter of any one or more of Examples 1-7 includes a memory device that includes the clock circuitry, the detection circuitry, and/or the processing circuitry.

In Example 9, the subject matter of Example 8 can include the memory device comprising a dynamic random access memory (DRAM) device.

Example 10 is a clock-swap circuit for a memory device, the clock-swap circuit comprising a swap signal generator configured to provide a swap signal indicative of an earlier-arriving one of an instruction (e.g., a NOP instruction or command) on a first command bus or a second command bus, and a multiplex circuit configured to receive an input clock signal from a clock divider circuit and the swap signal from the swap signal generator and, based on the swap signal, selectively provide an odd and even clock signal that is in phase with the input clock signal or out of phase with the input clock signal.

In Example 11, the subject matter of Example 10 can include or use the clock divider circuit to receive a system clock signal, and the input clock signal has a frequency that is lower than a frequency of the system clock signal.

In Example 12, the subject matter of any one or more of Examples 10-11 can include or use the first and second command busses, wherein the first and second command busses are configured to transmit memory commands for the memory device.

In Example 13, the subject matter of any one or more of Examples 10-12 can include the instruction on the first command bus or the second command bus comprise an instruction following a self-refresh command.

Example 14 is a method comprising generating a first clock signal and a second clock signal based on a system clock signal, the first clock signal and the second clock signal being mutually out of phase, providing a detection result indicating whether an initial operation of a self-refresh exit operation coincides with a rising edge of the first clock signal or on a rising edge of the second clock signal, receiving the first clock signal and the second clock signal and the detection result and, in response, providing an odd clock signal and an even clock signal corresponding to the first clock signal and the second clock signal, respectively, and providing the odd clock signal and the even clock signal out of phase with the first clock signal and the second clock signal when the detection result coincides with the rising edge of the first clock signal, and providing the odd clock signal and the even clock signal in phase with the first clock signal and the second clock signal when the detection result coincides with the rising edge of the second clock signal.

In Example 15, the subject matter of Example 14 can include initiating a duty cycle adjustment (DCA) routine to change a duty cycle timing characteristic of at least one of the first clock signal and the second clock signal.

In Example 16, the subject matter of any one or more of Examples 14-15 can include the odd clock signal and the even clock signal are each at a frequency of about one half the frequency of a system clock and 180 degrees out of phase with each other.

In Example 17, the subject matter of any one or more of Examples 14-16 can include initiating a command lockout for commands on a command bus of the memory device in coordination with the self-refresh exit operation.

In Example 18, the subject matter of any one or more of Examples 14-17 can include providing the odd clock signal and the even clock signal out of phase with the first clock signal and the second clock signal including swapping outputs of a clock divider.

In Example 19, the subject matter of any one or more of Examples 14-18 includes the self-refresh exit operation including a self-refresh entry (SRE) command and a self-refresh exit (SRX).

In Example 20, the subject matter of Example 19 can include the initial operation of the SRX command comprising a No Operation (NOP) command or a string of multiple NOP commands in sequence.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The detailed description herein is not to be taken in a limiting sense, and the scope of the various embodiments is defined only by the appended claims, along with the full scope of equivalents to which such claims are entitled.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus comprising:
   clock circuitry configured to generate a first clock signal and a second clock signal based on a system clock signal, the first clock signal and the second clock signal being mutually out of phase;
   detection circuitry configured to provide a detection result indicating whether an initial operation of a self-refresh exit operation coincides with a rising edge of the first clock signal or a rising edge of the second clock signal; and
   processing circuitry configured to:
     receive the first clock signal and the second clock signal and the detection result and, in response, provide an odd clock signal and an even clock signal corresponding to the first clock signal and the second clock signal, respectively; and
     provide the odd clock signal and the even clock signal out of phase with the first clock signal and the second clock signal when the detection result coincides with the rising edge of the first clock signal, and to provide the odd clock signal and the even clock signal in phase with the first clock signal and the second clock signal when the detection result coincides with the rising edge of the second clock signal.

2. The apparatus of claim 1, further comprising duty cycle adjustment (DCA) circuitry configured to change a duty cycle characteristic of at least one of the first clock signal and the second clock signal.

3. The apparatus of claim 1, wherein the odd clock signal and the even clock signal, are each at a frequency of about one half the frequency of the system clock signal of the apparatus and 180 degrees out of phase with each other.

4. The apparatus of claim 1, further comprising a command processor configured to process commands for the apparatus based on instructions on a command bus, wherein the command processor is configured to initiate a command lockout for commands on the command bus in coordination with the self-refresh exit operation.

5. The apparatus of claim 1, wherein instructions to provide the odd clock signal and the even clock signal out of phase with the first clock signal comprise swapping outputs of clock divider pairs.

6. The apparatus of claim 1, wherein the self-refresh exit operation includes a self-refresh entry (SRE) command and a self-refresh exit (SRX) command.

7. The apparatus of claim 1, further comprising a memory device that includes the clock circuitry, the detection circuitry, and the processing circuitry.

8. The apparatus of claim 6, wherein the initial operation of the self-refresh exit operation comprises a No Operation (NOP) command.

9. The apparatus of claim 7, wherein the memory device comprises a dynamic random access memory (DRAM) device.

10. A clock-swap circuit for a memory device, the clock-swap circuit comprising:
    a swap signal generator configured to provide a swap signal indicative of an earlier-arriving one of an instruction on a first command bus or a second command bus, wherein the swap signal indicates to:
      perform a swap in response to the earlier-arriving instruction being on the first command bus; and
      not perform a swap in response to the earlier-arriving instruction on the second command bus; and
    a multiplex circuit configured to receive an input clock signal from a clock divider circuit and the swap signal from the swap signal generator and, based on the swap signal, selectively provide an odd and even clock signal that is in phase with the input clock signal when the swap signal indicates to perform the swap or out of phase with the input clock signal when the swap signal indicates to not perform a swap.

11. The clock-swap circuit of claim 10, further comprising the clock divider circuit configured to receive a system clock signal, wherein the input clock signal has a frequency that is lower than a frequency of the system clock signal.

12. The clock-swap circuit of claim 10, further comprising the first command bus and the second command bus, wherein the first command bus and the second command bus are configured to transmit memory commands for the memory device.

13. The clock-swap circuit of claim 10, wherein the instruction on the first command bus or the second command bus comprises an instruction following a self-refresh exit command.

14. A method comprising:
    generating a first clock signal and a second clock signal based on a system clock signal, the first clock signal and the second clock signal being mutually out of phase;
    providing a detection result indicating whether an initial operation of a self-refresh exit operation coincides with a rising edge of the first clock signal or on a rising edge of the second clock signal;
    receiving the first clock signal and the second clock signal and the detection result and, in response, providing an odd clock signal and an even clock signal corresponding to the first clock signal and the second clock signal, respectively; and
    providing the odd clock signal and the even clock signal out of phase with the first clock signal and the second clock signal when the detection result coincides with the rising edge of the first clock signal, and providing the odd clock signal and the even clock signal in phase with the first clock signal and the second clock signal when the detection result coincides with the rising edge of the second clock signal.

15. The method of claim 14, further comprising initiating duty cycle adjustment (DCA) to change a duty cycle characteristic of at least one of the first clock signal and the second clock signal.

16. The method of claim 14, wherein the odd clock signal and the even clock signal are each at a frequency of about one half the frequency of a system clock and 180 degrees out of phase with each other.

17. The method of claim 14, further comprising initiate a command lockout for commands on a command bus in coordination with the self-refresh exit operation.

18. The method of claim 14, wherein providing the odd clock signal and the even clock signal out of phase with the first clock signal and the second clock signal comprises swapping outputs of a clock divider.

19. The method of claim 14, wherein the self-refresh exit operation includes a self-refresh entry (SRE) command and a self-refresh exit (SRX) command.

20. The method of claim 19, wherein the initial operation of the SRX comprises a No Operation (NOP) command.

* * * * *